(12) United States Patent
Hudson

(10) Patent No.: US 8,124,448 B2
(45) Date of Patent: Feb. 28, 2012

(54) SEMICONDUCTOR CHIP WITH CRACK DEFLECTION STRUCTURE

(75) Inventor: Russell Hudson, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/562,902

(22) Filed: Sep. 18, 2009

(65) Prior Publication Data
US 2011/0068435 A1 Mar. 24, 2011

(51) Int. Cl.
*H01L 21/00* (2006.01)
(52) U.S. Cl. .................. 438/106; 438/64; 257/E21.499
(58) Field of Classification Search .................. 438/63, 438/582
See application file for complete search history.

(56) References Cited

U.S. PATENT DOCUMENTS

| | | | |
|---|---|---|---|
| 5,831,330 A * | 11/1998 | Chang | 257/620 |
| 6,049,124 A | 4/2000 | Raiser et al. | |
| 6,492,247 B1 * | 12/2002 | Guthrie et al. | 438/460 |
| 6,493,229 B2 | 12/2002 | Akram et al. | |
| 2002/0024115 A1 * | 2/2002 | Ibnabdeljalil et al. | 257/620 |
| 2002/0043721 A1 | 4/2002 | Weber | |
| 2003/0100143 A1 * | 5/2003 | Mulligan et al. | 438/113 |
| 2004/0129938 A1 | 7/2004 | Landers et al. | |
| 2005/0042816 A1 | 2/2005 | Watanabe et al. | |
| 2006/0220250 A1 | 10/2006 | Kim et al. | |
| 2006/0278957 A1 | 12/2006 | Lin et al. | |
| 2007/0029641 A1 | 2/2007 | Hamatani et al. | |
| 2007/0069336 A1 | 3/2007 | Ning | |
| 2007/0145567 A1 | 6/2007 | Ning | |
| 2008/0067690 A1 | 3/2008 | Kumagai | |
| 2008/0083959 A1 | 4/2008 | Wu et al. | |
| 2009/0032847 A1 | 2/2009 | Tomita | |
| 2009/0115024 A1 * | 5/2009 | Jeng et al. | 257/620 |

FOREIGN PATENT DOCUMENTS
WO WO2009020713 A1 2/2009

OTHER PUBLICATIONS

Guotao Wang et. al.; *Chip-packaging interaction: a critical concern for Cu/low k packaging*; www.sciencedirect.com; Microelectronics Reliability 45 (2005) 1079-1093.
Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06/ $20.00 © 2006 IEEE; pp. 1595-1603.
John Baliga; *Yet Another Way to Use BCB*; Semiconductor International; http://www.semiconductor.net/article/CA6347341.html; Jul. 1, 2006; pp. 1-3.
PCT/US2010/048044 International Search Report mailed Dec. 17, 2010.

* cited by examiner

*Primary Examiner* — Cheung Lee
(74) *Attorney, Agent, or Firm* — Timohy M. Honeycutt (57) ABSTRACT

Various die crack deflection structures and methods of making the same are disclosed. In one aspect, a method of manufacturing is provided that includes fabricating a semiconductor chip including an outer edge, a first side and a second side opposite to the first side. A deflection structure is fabricated in the semiconductor chip. The deflection structure includes a sloped profile to deflect a crack propagating in the semiconductor chip toward the first side or the second side of the semiconductor chip.

17 Claims, 6 Drawing Sheets

SEMICONDUCTOR CHIP WITH CRACK DEFLECTION STRUCTURE

BACKGROUND OF THE INVENTION

1. Field of the Invention

This invention relates generally to semiconductor processing, and more particularly to apparatus and methods of deflecting cracks in semiconductor chips.

2. Description of the Related Art

Conventional semiconductor chips are routinely fabricated en masse in large groups as part of a single semiconductor wafer. At the conclusion of the processing steps to form the individual dice, a so-called dicing or sawing operation is performed on the wafer to cut out the individual dice. Thereafter, the dice may be packaged or directly mounted to a printed circuit board of one form or another. Conventional semiconductor dice are routinely cut out from the wafer as rectangular shapes. Many conventional semiconductor dice have four sides and four corners. The dicing operation is a mechanical cutting operation performed with a type of circular saw. Dicing saws are made with great care and operate more precisely than a comparable masonry circular saw. Despite these refinements, the dicing saw still imposes significant stresses on the individual dice as they are cut. These stresses and impact loads during the cutting operation can cause microscopic fractures in the dice, particularly at the die edges and corners. Once the cut dice are mounted to a package substrate or printed circuit board of one sort or another, the cracks introduced during cutting may propagate further into the center of the dice due to thermal stresses and other mechanical stresses that may be placed on the die. In addition, new cracks may form, particularly near the corners which create so-called stress risers by virtue of their geometries.

A conventional technique for addressing the propagation of cracks from the corners of a die involves the use of a crack stop. A conventional crack stop consists of a frame-like structure formed in and near the edges of the semiconductor die. When viewed from above, the crack stop looks like a picture frame. The conventional crack stop has a vertical profile, much like a fortress wall. One conventional variant also incorporates a surface-located continuous trench.

Many current semiconductor chip designs include an interconnect stack consisting of plural metallization and interlevel dielectric layers. During or subsequent to the dicing operation, delaminations of the interlevel dielectric layers can occur and propagate toward the sensitive interior areas of the die. A delamination of sufficient severity can possibly proceed laterally inward, and if unimpeded by a conventional crack stop, lay waste to the delicate circuit structures in the die interior.

The present invention is directed to overcoming or reducing the effects of one or more of the foregoing disadvantages.

SUMMARY OF THE INVENTION

In accordance with one aspect of the present invention, a method of manufacturing is provided that includes fabricating a semiconductor chip including an outer edge, a first side and a second side opposite to the first side. A deflection structure is fabricated in the semiconductor chip. The deflection structure includes a sloped profile to deflect a crack propagating in the semiconductor chip toward the first side or the second side of the semiconductor chip.

In accordance with another aspect of the present invention, a method of manufacturing is provided that includes fabricating an interconnect stack on a semiconductor substrate of a semiconductor chip. The interconnect stack includes an outer edge, a first side facing the semiconductor substrate and a second side opposite to the first side. A deflection structure is fabricated in the interconnect stack. The deflection structure includes a sloped profile to deflect a crack propagating in the semiconductor chip toward the second side of the interconnect stack.

In accordance with another aspect of the present invention, an apparatus is provided that includes a semiconductor chip that has an outer edge, a first side and a second side opposite to the first side. A deflection structure is in the semiconductor chip and includes a sloped profile to deflect a crack propagating in the semiconductor chip toward the first side or the second side of the semiconductor chip.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip that includes a crack deflection structure are disclosed. The exemplary deflection structures include a sloped profile that encourages crack propagation away from internal chip circuit structures. An optional sacrificial structure may be added as an additional deflection structure. Additional details will now be disclosed.

Figure 1:
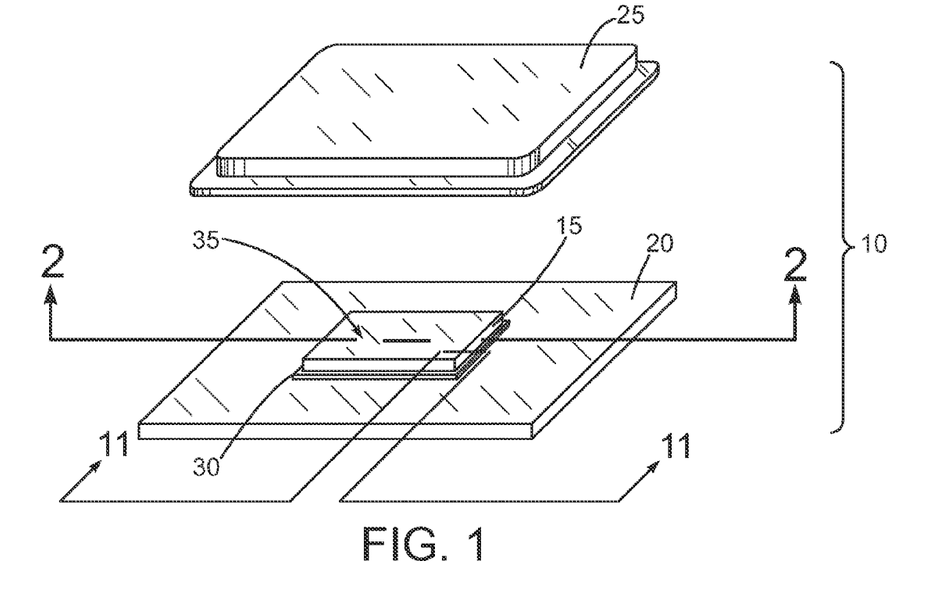
FIG. 1 is a partially exploded pictorial view of an exemplary embodiment of a semiconductor chip package that includes a semiconductor chip mounted on a carrier substrate.

In the drawings described below, reference numerals are generally repeated where identical elements appear in more than one figure. Turning now to the drawings, and in particular to FIG. 1, therein is shown a partially exploded pictorial view of an exemplary embodiment of a semiconductor chip package 10 that includes a semiconductor chip 15 mounted on a carrier substrate 20. An optional lid 25 may be seated on the carrier substrate 20 to serve as a platform and heat spreader to dissipate heat from the semiconductor chip 15. A small portion of an underfill material layer 30 is visible at the periphery of the semiconductor chip 15. The underfill material layer 30 is disposed between the semiconductor chip 15 and the carrier substrate 20 to address issues of differential coefficients of thermal expansion between the substrate 20 and various interconnect structures between the chip 15 and the substrate 20 that are not visible in FIG. 1.

The semiconductor chip 15 may be flip-chip mounted to the substrate 20 as shown with one side 35 visible and an opposite side (not visible) facing towards the substrate 20. The semiconductor chip 15 may be electrically connected to conductors in the substrate 20 by interconnects that are not visible in FIG. 1 but will be shown in subsequent figures. Optionally, wire bonding or other connection techniques may be used with or in lieu of flip-chip. The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core. Stacking of multiple dice is a design alternative. The semiconductor chip 15 may be fabricated using silicon, germanium or other semiconductor materials. If desired, the chip 15 may be fabricated as a semiconductor-on-insulator substrate or as bulk semiconductor. The side 35 of the semiconductor chip 15 may be fitted with a thermal interface material of organic or solder materials if desired.

The substrate 20 may be composed of ceramics or organic materials as desired. If organic, the substrate 20 may actually consist of multiple layers of metallization and dielectric materials that electrically interconnect the semiconductor chip 15 to some other component, such as a board (not shown). The substrate 20 may interconnect electrically with external devices, such as another circuit board, in a variety of ways, such as via a pin grid array, a land grid array, a ball grid array or other configuration. The number of individual layers for the substrate 20 is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill. Of course, the substrate 20 could be configured as something other than a package substrate, such as a printed circuit board serving as a motherboard, a daughter board, a card or some other type of board.

The underfill material 39 is designed to lessen the effects of differences in coefficient of thermal expansion (CTE) between the chip 15 and the substrate 20. The underfill material 30 may be composed of well-known epoxy materials, such as epoxy resin with or without silica fillers and phenol resins or the like.

The optional lid 25 may be configured as a top hat design as disclosed, as a bathtub design, a glob top or some other configuration. The lid 25 may be composed of well-known plastics, ceramics or metallic materials as desired. Some exemplary materials include nickel plated copper, anodized aluminum, aluminum-silicon-carbon, aluminum nitride, boron nitride or the like. The lid 25 may be secured to the substrate 20 by an adhesive composed of a well-known thixotropic adhesive or other well-known type of package adhesive as desired. However, the lid 25 may be omitted entirely if a lidless design is desired.

Figure 2:
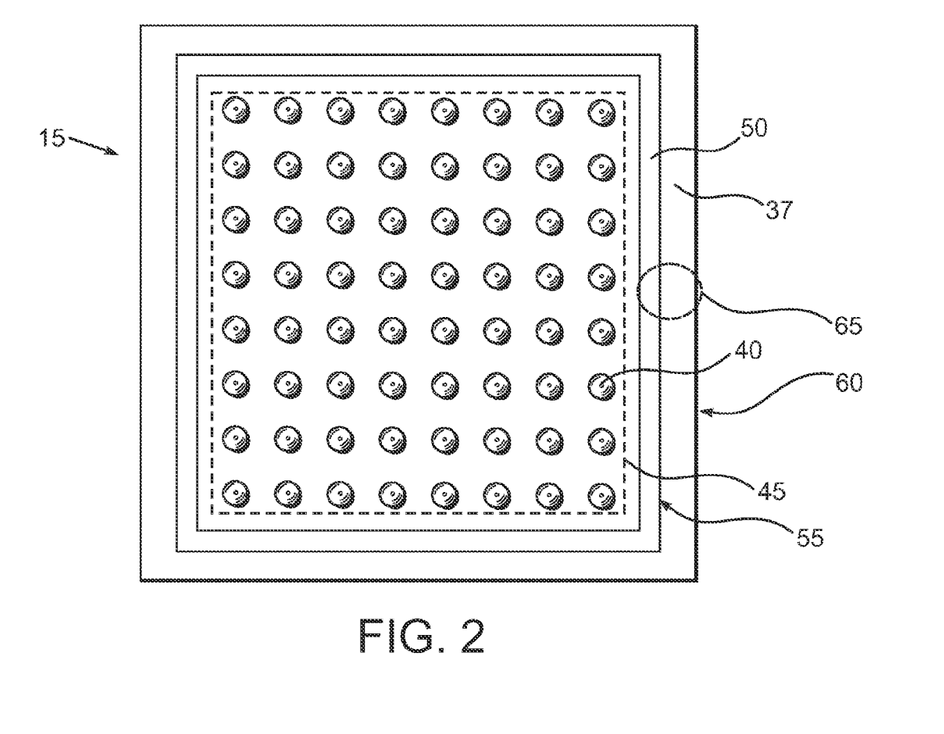
FIG. 2 is a sectional view of FIG. 1 taken at section 2-2.

Attention is now turned to FIG. 2, which is a sectional view of FIG. 1 taken at section 2-2. Note the location of section 2-2 is such that the side 35 of the semiconductor chip 15 visible in FIG. 1 is obscured and the opposite side 37 of the chip 15 is visible. In order to electrically interconnect the semiconductor chip 15 with the carrier substrate 20, a plurality of solder bumps that are collectively labeled 40 may be provided on the side 37. The bumps 40 may be joined to a corresponding plurality of solder structures on the carrier substrate that are not visible using a well-known C4 control collapse solder bump reflow process. Optionally, other types of structures may be used to interconnect the chip 15 to the carrier substrate 20, such as conductive pillars of copper, aluminum, combinations of these, or the like with or without the addition of solder materials. The solder bumps 40 are positioned generally within a device region of the chip 15 that is delineated by the dashed box 45. The myriad of circuit structures, such as transistors, capacitors, inductors and others that make up the logic structures of the semiconductor chip 15 are generally positioned within the device region 45. There may be circuit structures positioned in the portion of the semiconductor chip 15 external to the device region 45 if desired.

In this illustrative embodiment, the semiconductor chip 15 is provided with a crack deflection structure 50 that may be configured as a frame-like structure when viewed in FIG. 2 that surrounds but is laterally separated from the device region 45 and the array of solder structures 40. The outer edge 55 of the crack deflection structure 50 is inset laterally from the outer edge 60 of the semiconductor chip 15. The purpose of the crack deflection structure 15 is as its name implies, to deflect cracks and/or delaminations propagating from, for example, the edge 60 toward the device region 45. Such migrating cracks and delaminations can create significant electrical and structural problems. A small portion of the semiconductor chip 15 and the crack deflection structure 50 thereof circumscribed by the dashed oval 65 will be shown at greater magnification in FIG. 3 to illustrate additional features.

Figure 3:
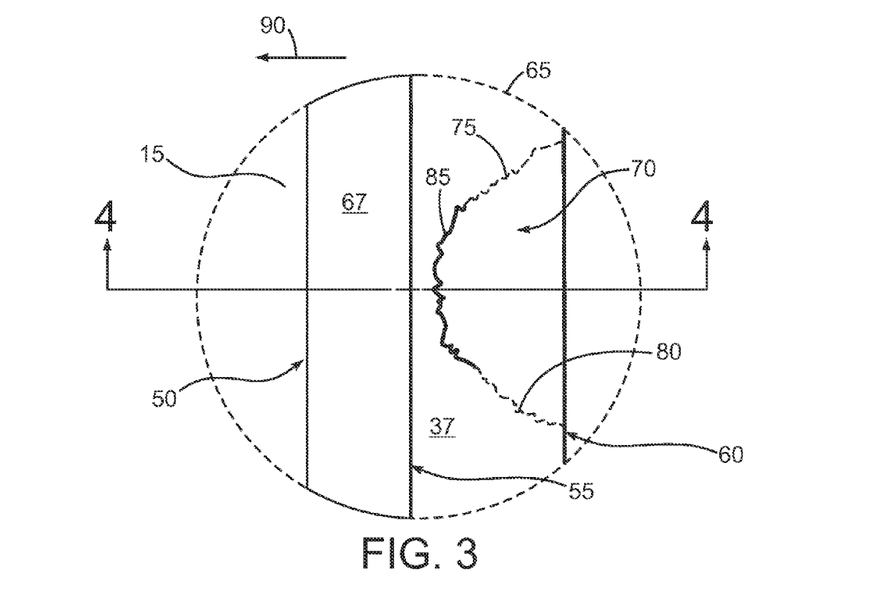
FIG. 3 is a portion of FIG. 2 shown at greater magnification.

Attention is now turned to FIG. 3, which as just noted is a small portion of the semiconductor chip 15 circumscribed by the dashed oval 65 in FIG. 2 shown at greater magnification. The edge 60 of the semiconductor chip 15, and the edge 55 of the crack deflection structure 50 are clearly visible in FIG. 3. However, it should be understood that the crack deflection structure 50 is not a monolithic structure but is instead an assembly of a series of stacked elements, the uppermost of which is labeled 67 and the remainder of which are latent in FIGS. 2 and 3. To illustrate the functionality of the crack deflection structure 50, a hypothetical delamination region 70 is depicted. The more detailed structure of the delamination region 70 will be explained in greater detail in conjunction with FIG. 4. At this point, portions of the delamination region 70 that have delaminated in lower regions of the chip 15 are represented by the jagged dashed lines 75 and 80. Where the delamination region 70 has reached the upper surface 37 of the semiconductor chip 15, a crack 85 is visible. The crack deflection structure 50 is provided with a configuration that encourages the delamination region to produce a fracture somewhere at or before the edge 55 so that a portion of the semiconductor chip 15 chips out and the delamination region 70 does not extend further inward along the direction of the arrow 90. In this way, other delicate structures of the same semiconductor chip 15 are not jeopardized by mechanical disruption.

Figure 4:
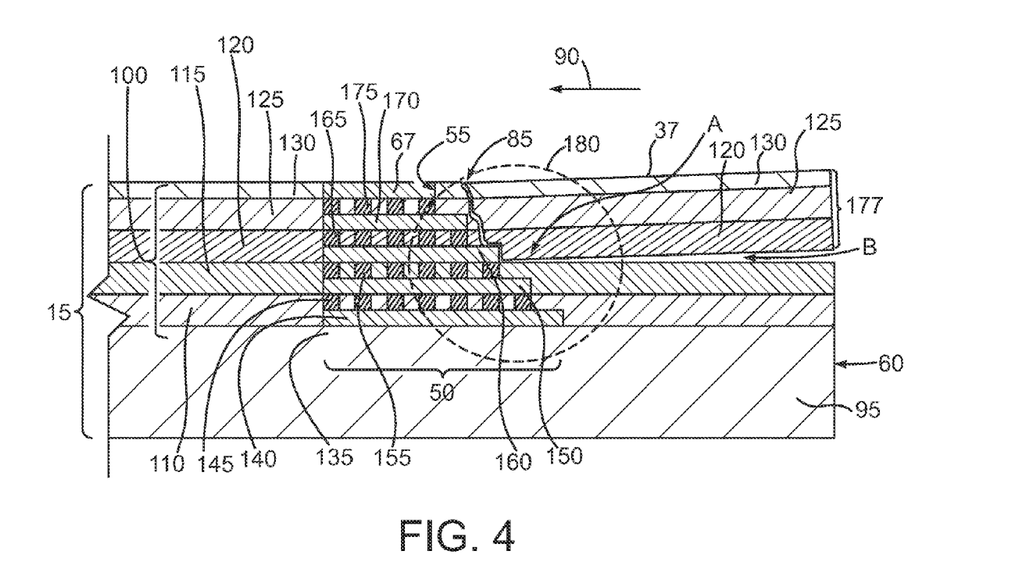
FIG. 4 is a sectional view of FIG. 3 taken at section 4-4.

Additional features of the crack deflection structure 50 may be understood by referring now to FIG. 4, which is a sectional view of FIG. 3 taken at section 4-4. The semiconductor chip 15 includes a semiconductor substrate or device portion 95 in which the plural circuit structures such as transistors, capacitors, inductors and others that are necessary to implement whatever logic functions that the chip 15 is designed to do are positioned. These structures are not visible in FIG. 4 but are nevertheless located somewhere within the semiconductor device portion 95. The semiconductor device portion 95 could be constructed of bulk semiconductor or as a semiconductor-on-insulator arrangement. An interconnect stack 100 is formed on the device layer 95 and consists of a plurality of alternating layers of insulating material and metallic materials. In this illustrative embodiment, there are five insulating material layers 110, 115, 120, 125 and 130. The crack deflection structure 50 is fabricated with a sloped profile that forces a propagating crack or delamination to deflect towards one or other side of the chip 15, in this case the side 37. The crack deflection structure 50 could be manufactured as a monolithic structure by, for example, lithographic patterning a suitable opening in the interconnect stack 100 and depositing suitable material(s), such as metals. However, in this illustrative embodiment, alternating groups of vias and interconnect layers are used to build up the crack deflection structure 50. This design has the advantage of easily threading into the existing series of insulating material layer, via and metal layer fabrication steps used to form the interconnect stack. It should be understood that the number of vias and interconnect layers may be varied. In this illustrative embodiment, the crack deflection structure 50 may include an interconnect layer formed on semiconductor device layer 95, a set of vias 145 formed in the insulating layer 110 and another interconnect layer 150 formed on the vias 145. Proceeding further upward, another set of vias 155 is formed in the insulating layer 115 and topped by an interconnect layer 160 and another set of vias 165 formed in the insulating layer 120 and capped by an interconnect layer 170. Finally, another set of vias 175 is formed in the insulating layer 125 and capped by the previously disclosed top structure 67 of the crack deflection structure 50. The various interconnect layers 140, 150, 160, 170 and 67 are formed with progressively shorter lateral dimensions such that the edge 55 of the uppermost interconnect layer 67 is inset along the direction of arrow 90 farther than the next lower interconnect layer 170 and so forth. This stair stepped configuration provides a tapered or sloped profile that encourages any fractures to follow that tapered profile and propagate up to the upper surface 35 of the chip 15.

In this hypothetical illustration, the crack 85 originates approximately at point A within the insulating layer 120 due to the delamination between the insulating layer 120 and the next underlying insulating layer 115 at location B. The delamination at B can be caused by a variety of mechanisms, such as the flaking during dicing operations described generally in the Background section hereof. In any event, as the delamination at B occurs, and the crack 85 begins generally at location A, the sloped nature of the crack deflection structure 50 causes the crack 85 to propagate upward quickly to the upper surface 35 and create a fleck 177 that consists of broken off portions of the insulating layers 120, 125 and 130. In this way, portions of the chip 15 near the edge 60 thereof that have been damaged due to dicing or other mechanical processes are encouraged to chip out without causing crack propagation to proceed laterally into the more sensitive structures of the chip 15. The same benefit will be obtained for cracks propagating in or across layers.

Figure 5:
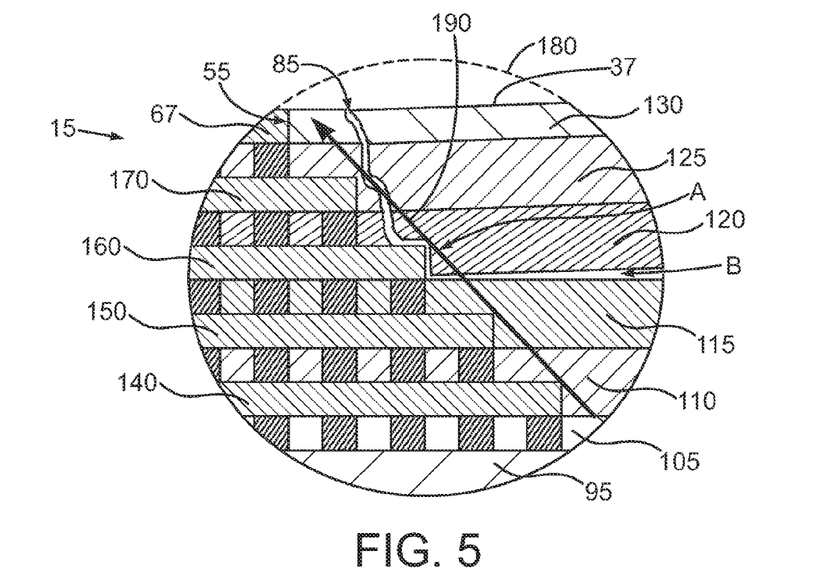
FIG. 5 is a portion of FIG. 4 shown at greater magnification.

A portion of FIG. 4 is shown circumscribed by the dashed oval 180 is shown at greater magnification in FIG. 5. Attention is now turned to FIG. 5. The circumscribed portion includes a small portion of the device layer 95, the insulating layers 110, 115, 120, 125 and 130, the groups 145, 155, 165 and 175 of vias and the interconnect layers 140, 150, 160, 170 and 67. The delamination at area B has induced the crack 85 originating generally at the point A. In this illustration, the crack 85 has followed the general sloping profile represented by the arrow 190 and emerged at the surface 37 of the insulating layer 130 near the edge 55 of the interconnect layer 67. It is possible that the crack 85 may actually track the contours of the interconnect layers 170 and 67 by successive delaminations proximate those structures and thus surface right at the edge 55. Again the goal is to encourage weakened portions of the semiconductor chip 15 to fleck off and halt the inward migration of any cracks.

The groups 145, 155, 165 and 175 of vias and the interconnect layers 140, 150, 160, 170 and 67 may be fabricated from a variety of materials. Exemplary materials include copper, aluminum, gold, silver, palladium, platinum, combinations of these or the like. A given set of vias, such as the set 175, may be formed by lithographically making a suitable opening in the insulating layer 125 followed by a material deposition step, such as plating, physical vapor deposition or the like. A given interconnect layer, such as the interconnect layer 67, may be similarly formed. As an alternative to plural spaced vias, other shapes of interconnects structures could be used.

Figure 6:
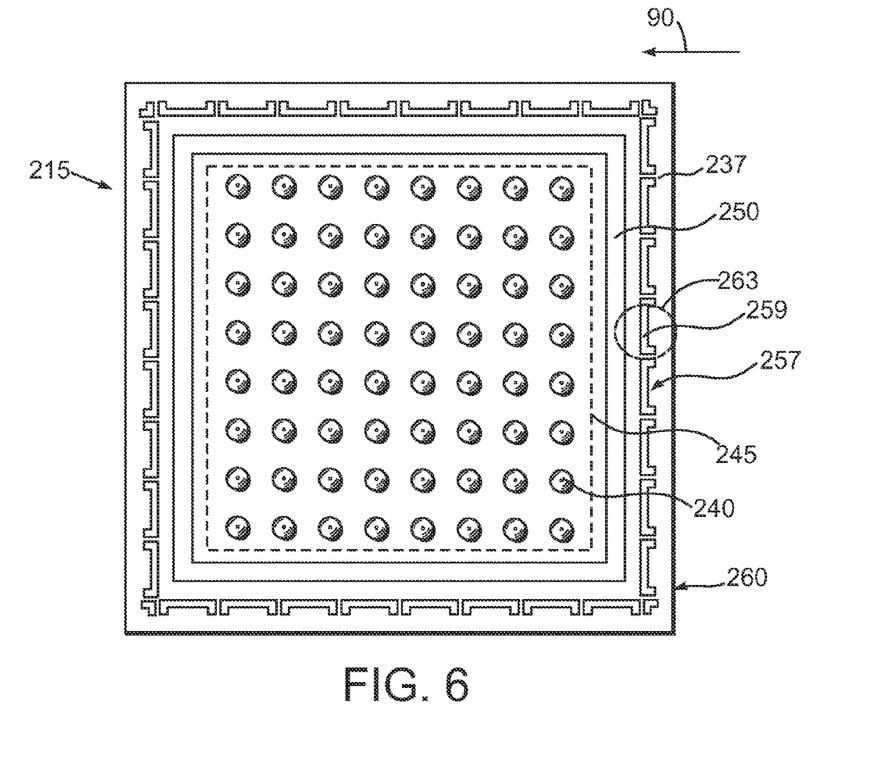
FIG. 6 is a sectional view like FIG. 2 but of an alternate exemplary embodiment of a semiconductor chip with an exemplary crack deflection structure.

An alternate exemplary embodiment of a semiconductor chip 215 may be understood by referring now to FIG. 6, which is a view like FIG. 2 showing a surface 237 of the chip 215 that includes plural interconnect solder structures 240 positioned generally within a device region 245. A crack deflection structure 250 may be provided for the chip 215 and configured as generally described elsewhere herein in conjunction with the crack deflection structure 50. In addition however, a sacrificial structure 257 may be provided around the crack deflection structure 250 to provide an additional protection against the propagation of delaminations and delamination induced fractures. The sacrificial structure 257 may consist of a plurality of segments, one of which is labeled 259. The various segments of the sacrificial structure 257 are positioned between the deflection structure 250 and the outer edge 260 of the semiconductor chip 215. For example, the segment 259 is set back from the edge 260 along the direction 90. The following description of the segment 259 will be illustrative of the other segments of the sacrificial structure 257. Additional details of the segment 259 will be described in conjunction with FIG. 7, which is the portion of FIG. 6 circumscribed by the dashed oval 263 shown in greater magnification.

Figure 7:
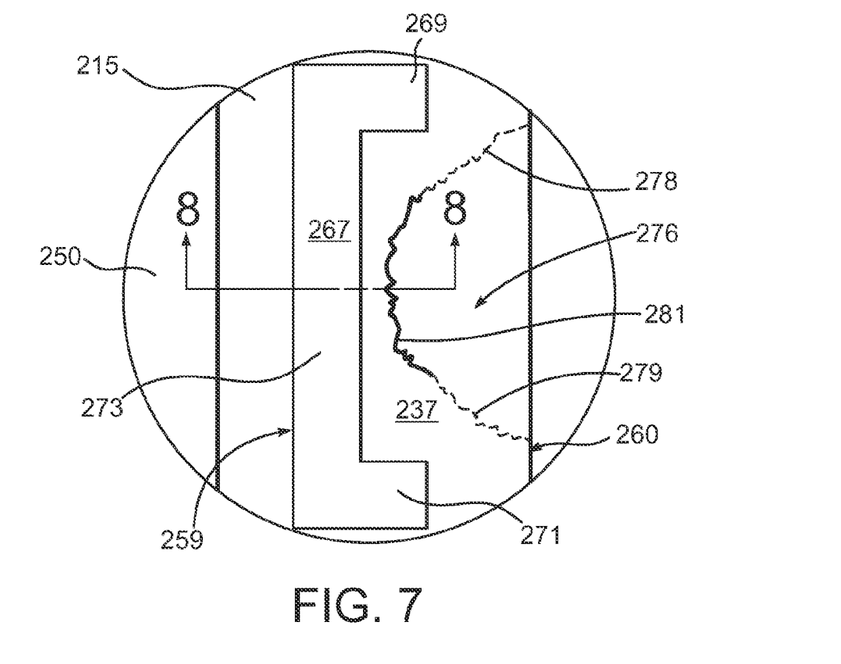
FIG. 7 is a portion of FIG. 6 shown at greater magnification.

Attention is now turned to FIG. 7. Note that a small portion of the crack deflection structure 250, the segment 259 and the edge 260 of the semiconductor chip 215 are visible. As was the case with the crack deflection structure 50 depicted in the other figures, only an upper portion of the segment 259 is actually visible in FIG. 7. This upper portion is labeled 267. The upper portion 267 includes a pair of tabs 269 and 271 that bracket a central portion 273. Together, the tabs 269 and 271 and the central portion 273 form a channel shape that is designed to constrain the propagation of a hypothetical delamination region 276 that consists of latent portions 278 and 279 that produce a visible crack 281 in the surface 237 of the semiconductor chip 215.

Figure 8:
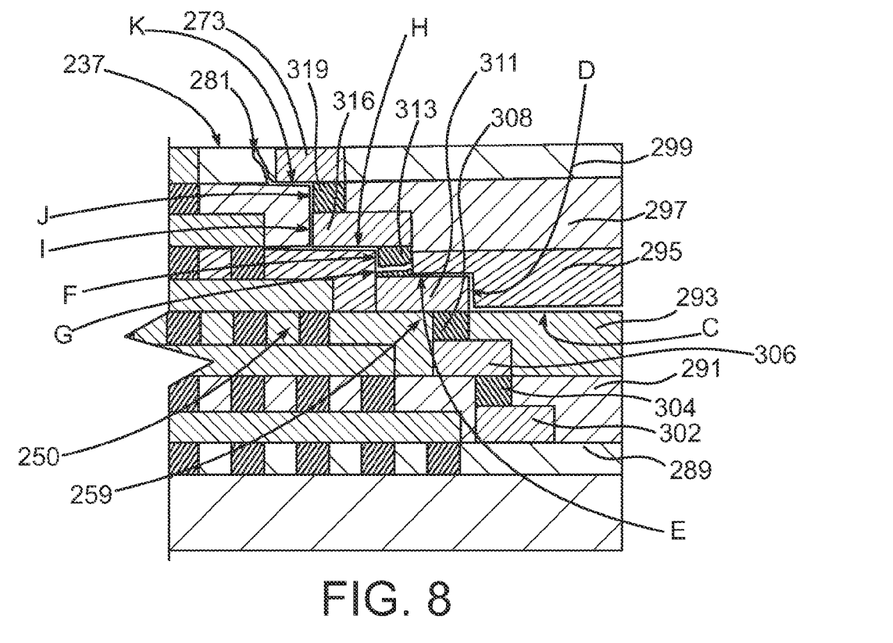
FIG. 8 is a sectional view of FIG. 7 taken at section 8-8.

Additional details of the segment 259 may be understood by referring now also to FIG. 8, which is a sectional view of FIG. 7 taken at section 8-8. The crack deflection structure 250 depicted in FIG. 8 may be generally configured like the crack deflection 50 described elsewhere herein and for simplicity of illustration does not include separate numbering for the elements thereof. Due to the position of section 8-8, a portion of the central portion 273 of the segment 259 is visible. As noted above, most of the segment 259 is not visible in FIG. 7. This is clearly illustrated in FIG. 8, where it is observed that the segment 259 consist of the upper portion 273, followed by a stair stepped arrangement. The chip 215 may be provided with stacked insulating layers 289, 291, 293, 295, 297 and 299 that may be configured substantially like the dielectric layers 105, 110, 115, 120, 125 and 130 depicted in FIGS. 4 and 5. The segment 259 includes a sloped profile that may track the sloped profile of the deflection structure. Here, the sloped profile is facilitated by the stair stepped arrangement consisting of a structure 302, an interconnecting via 304, a structure 306, an interconnecting via 308, a structure 311, an interconnecting via 313, a structure 316 and a via 319 that is connected to the aforementioned top portion 273. This alternating via and structure arrangement will again integrate easily into the lithography and material deposition steps used to define metallization and interlevel dielectric layers for the semiconductor chip 215.

Assume for the purposes of illustration that a delamination has occurred at area C so that the insulating layer 295 is delaminating from the underlying insulating layer 293. The sacrificial structure segment 259, particularly for this hypothetical, the structure 311 and the via 313, provides a natural interface at D, E and F for the delamination to follow. In this hypothetical, the via 316 has failed at G and the delamination has proceeded along the interface between the sacrificial structure 259 and the insulating layers 295, 297 and 299 at H, I, J and K. The fracture 281 then emanates through the insulating layer 299 at the side 237 as shown. The point is that the sacrificial structure segment 259 and the other similar segments provide an additional barrier against the propagation of delamination and cracks caused thereby and also provides a mechanically favorable interface for which delaminations and/or in-layer cracks can follow and allow for flecks to chip out as with the other illustrative embodiments disclosed herein. It should be understood that the sacrificial structure segment 259 could be co-terminus laterally with the deflection structure 250.

Figure 9:
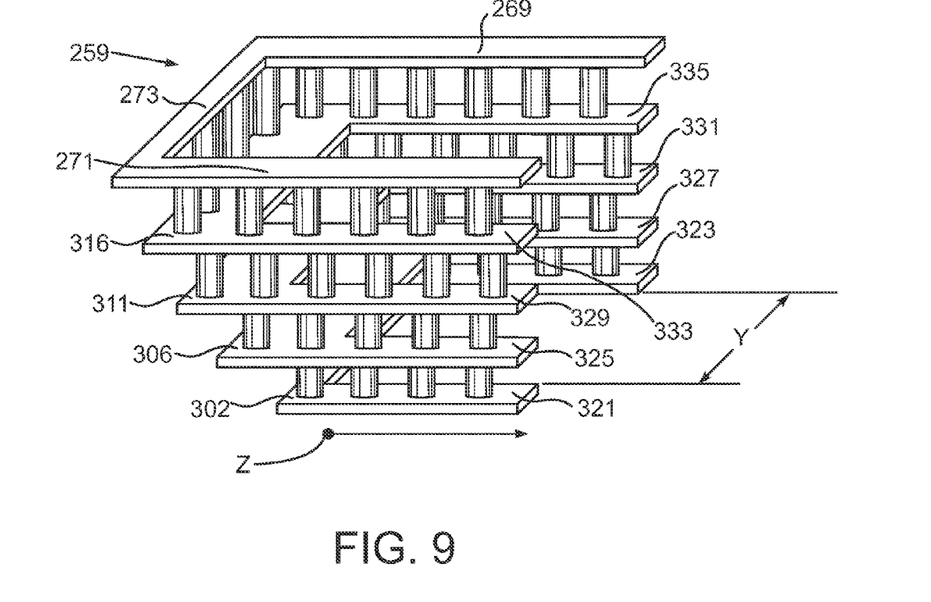
FIG. 9 is a pictorial view of an exemplary embodiment of a sacrificial crack deflection structure.

Further details of the segment 259 may be understood by referring now to FIG. 9, which depicts a pictorial view of the segment 259 removed from the semiconductor chip. Here, the central portion 273 and the tabs 269 and 271 that are visible in FIG. 7 as well are clearly shown. The other structures 302, 306, 311 and 316 are also visible. In addition, it is apparent that the structures 316, 311, 308 and 302 are positioned at staggered positions (as is shown also in FIG. 8) and include respective sets of tabs of staggered lengths. For example, the structure 302 includes tabs 321 and 323, the structure 308 includes tabs 325 and 327, the structure 311 includes tabs 329 and 331 and the structure 316 includes tabs 333 and 335. The tabs 269, 271, 321, 323, 325, 327, 329, 331, 333 and 335 may all terminate at approximately the same point laterally on one end and of course are staggered at the other end. Overall, the segment 259 approximates a scoop structure. Variations of the basic design depicted in FIG. 9 are envisioned. For example, portions of the tabs 269, 271, 321, 323, 325, 327, 329, 331, 333 and 335 to the right of the point Z could be eliminated. In another variant, the spacing Y between tabs could increase progressively with successive structures 306, 311, 316 and 273.

Figure 10:
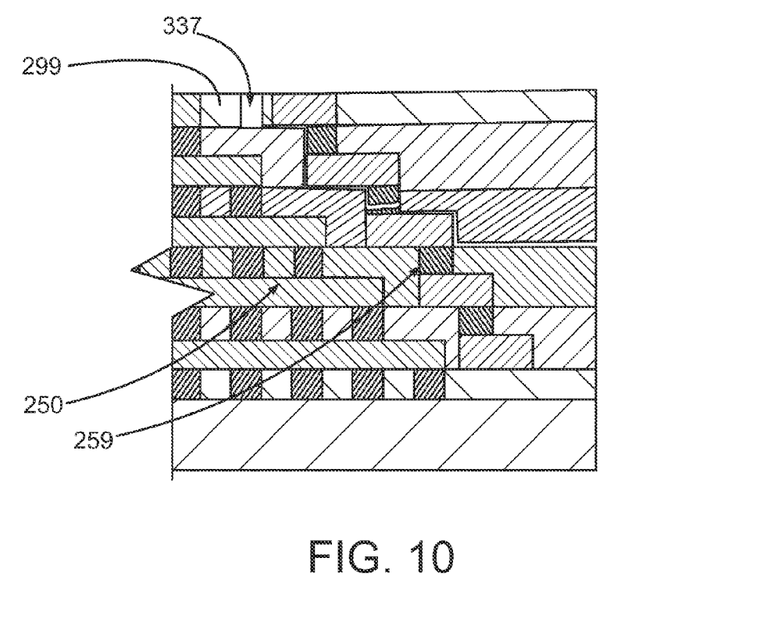
FIG. 10 is a sectional view of a portion of the exemplary semiconductor chip package depicted in FIG. 1.

Another alternate exemplary embodiment of a semiconductor chip 315 may be understood by referring now to FIG. 10, which is a sectional view like FIG. 8. For simplicity of illustration, the crack deflection 250 and the sacrificial structure segment 259 are labeled but their individual constituents are not separately labeled. In addition, the various insulating layers that were described in conjunction with FIG. 8 are not separately labeled. In this illustrative embodiment, the insulating layer 299 may be provided with a trench 337 that provides a natural location for the ultimate emergence of a delamination or otherwise induced fracture. The trench 337 may act as a natural pivot point for the upward flecking off or chipping out of the delaminated insulating layers. The trench 337 may be formed by well-known lithographic patterning techniques. It should be understood that the trench 337 may be used without the sacrificial structure segment(s) 259 and could be segmented or continuous around the periphery of the semiconductor chip 315.

Figure 11:
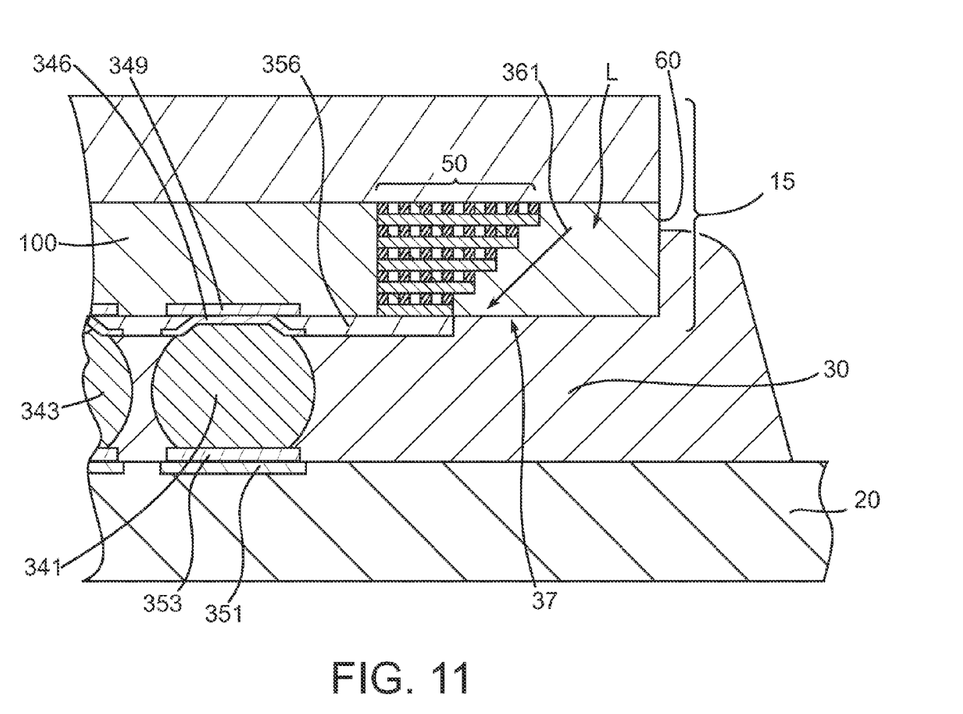
FIG. 11 is sectional view of FIG. 1 taken at section 11-11.

The geometry of the crack deflection structure 50 in relation to other portions of the semiconductor chip 15 may be understood by referring now to FIG. 11, which is a sectional view of FIG. 1 taken at section 11-11 and depicts just a small portion of the semiconductor chip 15 and the underlying carrier substrate 20. The section includes the edge 60 of the semiconductor chip 15 and shows the crack deflection structure 50 in section and positioned on the device layer 95. The interconnect stack 100 depicted in FIG. 4 as the multiplicity of interspersed insulating layers is depicted in FIG. 11 as a monolithic layer for simplicity of illustration in FIG. 11. Here, one solder joint and a portion of another of the solder joints that electrically interconnect the semiconductor chip to the carrier substrate 20 are shown. In particular, the solder joint 341 may consist of one of the aforementioned solder bumps 40 depicted in FIG. 2 metallurgically joined to another solder bump of the carrier substrate 20 and reflowed to form the solder joint 341. The solder joint 343 may be similarly constructed. The solder joint 341 is metallurgically connected to an underbump metallization structure 346 of the chip 15 that is in turn formed on a bump pad 349. The carrier substrate is provided with a metallization structure 351 upon which a bump pad 353 is formed. The pads 346, 349, 351 and 353 may be composed of nickel, gold, chrome, copper, silver, palladium combinations of these or the like. An insulating layer suitable for the construction of solder bumps and bump structures thereon is shown and labeled 356 and may consist of one or more passivation layers and/or a polymeric layer such as a polyimide material layer. A portion of the underfill material layer 30 is shown. As noted elsewhere herein, if a delamination occurs, say at the location L within the dielectric stack, the presence of the sloped crack deflection structure 50 encourages the delamination and any cracks caused thereby to track along the direction indicated by the arrow 361 and emerge somewhere at the surface 37 and thus not proceed laterally inward towards the solder structures 341 and 343 or the sensitive circuit structures that are formed inside of the chip 15. The same would hold true if a sacrificial structure of the type described elsewhere were incorporated.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
fabricating a semiconductor chip including an outer edge, a first side and a second side opposite to the first side;
fabricating a deflection structure in the semiconductor chip, the deflection structure including a sloped profile to deflect a crack propagating in the semiconductor chip toward the first side or the second side of the semiconductor chip; and
fabricating a sacrificial structure in the semiconductor chip between the deflection structure and the outer edge, wherein the sacrificial structure includes a plurality of non-metallurgically connected segments disposed about a periphery of the semiconductor chip, each of the segments sloping away from the outer edge.

2. The method of claim 1, comprising fabricating a trench in the first side or the second side of the semiconductor chip between the deflection structure and the outer edge.

3. The method of claim 1, wherein the sloped profile slopes away from the outer edge.

4. The method of claim 1, wherein the fabricating of the deflection structure comprises fabricating plural stacked metal layers where each two adjacent of the plural metal layers are interconnected by a plurality of vias.

5. A method of manufacturing, comprising:
fabricating an interconnect stack on a semiconductor substrate of a semiconductor chip, the interconnect stack including an outer edge, a first side facing the semiconductor substrate and a second side opposite to the first side;
fabricating a deflection structure in the interconnect stack, the deflection structure including a sloped profile to deflect a crack propagating in the semiconductor chip toward the second side of the interconnect stack; and
fabricating a trench in the second side of the interconnect stack inward from the outer edge and over a portion of the deflection structure, the trench not extending to the first side.

6. The method of claim 5, comprising fabricating a sacrificial structure in the interconnect stack between the deflection structure and the outer edge.

7. The method of claim 6, wherein the sacrificial structure comprises a sloped profile.

8. The method of claim 6, wherein the sacrificial structure comprises a plurality of segments disposed about a periphery of the interconnect stack.

9. The method of claim 8, wherein the sacrificial structure includes a plurality of non-structurally contiguous segments disposed about a periphery of the semiconductor chip.

10. The method of claim 5, wherein the sloped profile slopes away from the outer edge.

11. The method of claim 5, wherein the fabricating of the deflection structure comprises fabricating plural stacked metal layers where each two adjacent of the plural metal layers are interconnected by a plurality of vias.

12. The method of claim 5, wherein the trench is segmented around the periphery of the semiconductor chip.

13. An apparatus, comprising:
a semiconductor chip including an outer edge, a first side and a second side opposite to the first side;
a deflection structure in the semiconductor chip, the deflection structure including a sloped profile to deflect a crack propagating in the semiconductor chip toward the first side or the second side of the semiconductor chip; and
a sacrificial structure in the semiconductor chip between the deflection structure and the outer edge, wherein the sacrificial structure includes a plurality of non-metallurgically connected segments disposed about a periphery of the semiconductor chip, each of the segments sloping away from the outer edge.

14. The apparatus of claim 13, comprising a trench in the first side or the second side of the semiconductor chip between the deflection structure and the outer edge.

15. The apparatus of claim 13, wherein the deflection structure comprises plural stacked metal layers where each two adjacent of the plural metal layers are interconnected by a plurality of vias.

16. The apparatus of claim 13, wherein the semiconductor chip comprises a semiconductor substrate and an interconnect stack fabricated thereon and the deflection structure is positioned in the interconnect stack.

17. An apparatus, comprising:
a semiconductor chip including a semiconductor substrate and an interconnect stack on the semiconductor substrate, the interconnect stack including an outer edge, a first side facing the semiconductor substrate and a second side opposite to the first side;
a deflection structure in the interconnect stack, the deflection structure including a sloped profile to deflect a crack propagating in the semiconductor chip toward the second side of the interconnect stack; and
wherein the second side of the interconnect stack includes a trench inward from the outer edge and over a portion of the deflection structure, the trench not extending to the first side.

* * * * *